United States Patent
Härle

(10) Patent No.: US 8,658,446 B2
(45) Date of Patent: Feb. 25, 2014

(54) METHOD FOR FABRICATING SEMICONDUCTOR SUBSTRATE FOR OPTOELECTRONIC COMPONENTS

(75) Inventor: Volker Härle, Laaber (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 689 days.

(21) Appl. No.: 12/290,707

(22) Filed: Nov. 3, 2008

(65) Prior Publication Data

US 2009/0068776 A1 Mar. 12, 2009

Related U.S. Application Data

(62) Division of application No. 10/770,698, filed on Feb. 2, 2004, now Pat. No. 7,446,346.

(30) Foreign Application Priority Data

Jan. 31, 2003 (DE) .................................. 103 03 967
Feb. 27, 2003 (DE) .................................. 103 08 646

(51) Int. Cl.
*H01L 21/00* (2006.01)

(52) U.S. Cl.
USPC ................... 438/29; 438/22; 438/37; 438/45; 257/E33.068

(58) Field of Classification Search
USPC ................................................ 438/22, 37, 45
See application file for complete search history.

(56) References Cited

U.S. PATENT DOCUMENTS

| | | | |
|---|---|---|---|
| 5,103,271 A | 4/1992 | Izumiya et al. | |
| 5,376,580 A | 12/1994 | Kish et al. | |
| 5,862,167 A | 1/1999 | Sassa et al. | |
| 6,153,444 A | 11/2000 | Nakano et al. | |
| 6,160,867 A | 12/2000 | Murakami | |
| 6,255,201 B1* | 7/2001 | Yoshida et al. | 438/535 |
| 6,255,681 B1 | 7/2001 | Pan | |
| 6,607,931 B2 | 8/2003 | Streubel | |
| 7,138,291 B2* | 11/2006 | McClure et al. | 438/105 |
| 2001/0042866 A1 | 11/2001 | Coman et al. | |
| 2003/0043382 A1* | 3/2003 | Borden et al. | 356/502 |

FOREIGN PATENT DOCUMENTS

| | | |
|---|---|---|
| DE | 44 40 072 C1 | 2/1996 |
| DE | 100 00 088 A1 | 8/2000 |
| DE | 100 08 583 A1 | 9/2001 |

OTHER PUBLICATIONS

W.J. Choyke et al. "Silicon carbide: recent major advances", Springer, 2004, p. 255.

* cited by examiner

*Primary Examiner* — S. V. Clark
*Assistant Examiner* — Jesse Y Miyoshi
(74) *Attorney, Agent, or Firm* — Cozen O'Connor

(57) ABSTRACT

Presented is a method for fabricating a semiconductor substrate. The method includes implanting impurity material into the semiconductor substrate, and forming a reflective layer-like zone in the semiconductor substrate that includes the impurity material.

13 Claims, 2 Drawing Sheets

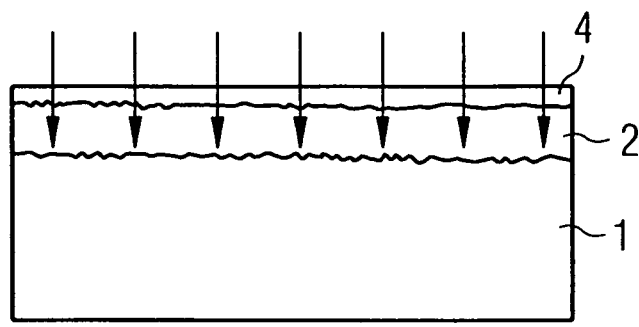
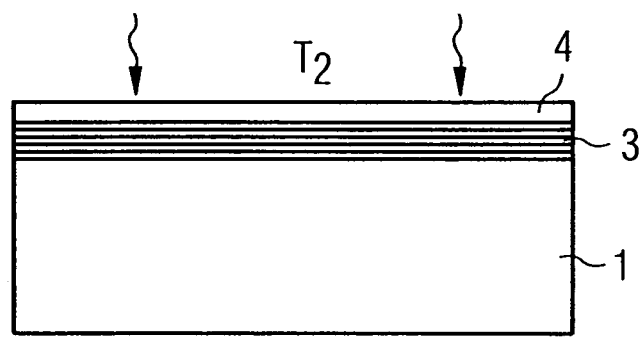
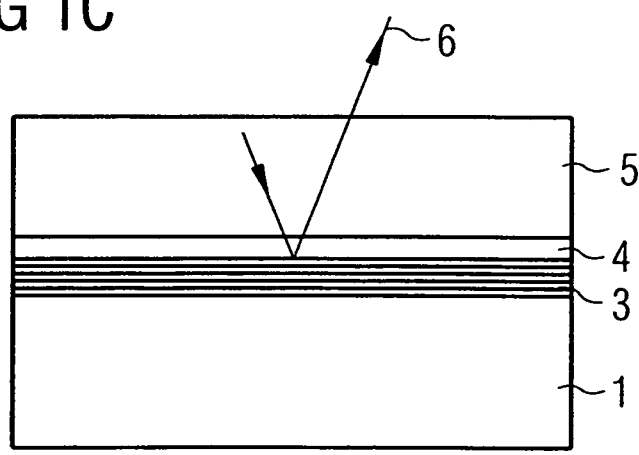

METHOD FOR FABRICATING SEMICONDUCTOR SUBSTRATE FOR OPTOELECTRONIC COMPONENTS

CROSS-REFERENCE TO RELATED APPLICATIONS

This patent application is a division of U.S. patent application Ser. No. 10/770,698, filed Feb. 2, 2004 now U.S. Pat. No. 7,446,346. Priority is claimed on German Application Nos. 103 03 967.8, filed Jan. 31, 2003 and 103 08 646, filed Feb. 27, 2003. The disclosure content of U.S. patent application Ser. No. 10/770,698 and the German priority documents are hereby incorporated by reference.

BACKGROUND OF THE INVENTION

1. Field of the Invention

The invention is related to a method for fabricating semiconductor substrate for optoelectronic components.

2. Description of the Related Art

In some radiation-emitting optical components, in particular in high-efficiency LEDs there is the problem that the light generated in the radiation-emitting structures is radiated in all spatial directions and thus also in the direction of the substrate, for which reason a large part of the light is lost in the case where absorbent substrates are used. This problem can be avoided by using transparent substrates. However, the disadvantages of some transparent substrates are that they have only a low electrical conductivity and/or an epitaxial deposition of the radiation-emitting structures is not possible owing to a lack of lattice matching. The problem of the lack of lattice matching for the deposition of epitaxial layers also occurs if absorbent semiconductor substrates are mirror-coated by the application of thin layers, for example of metal layers, at their top side in order to prevent the emitted radiation from penetrating into the substrate.

One possibility for avoiding this problem is disclosed in U.S. Pat. No. 5,376,580. In the method described therein, a radiation-emitting LED structure is firstly grown epitaxially on a lattice-matched growth substrate, then separated from the absorbent substrate and connected by means of wafer bonding to a substrate which has good electrical conductivity and is optically transparent to the relevant radiation. In this known method, however, the epitaxially grown LED structure, the electrical and optical properties of which, as is known, depends to a considerable extent on the crystal quality of the epitaxial layers, is subjected, during the separation of the absorbent substrate, to additional mechanical (for example grinding, polishing, etc.) and/or chemical method steps (for example etching), which may lead to damage to said structure.

A method for fabricating an optically transparent substrate onto which a semiconductor substrate can be grown epitaxially, and in which mechanical and/or chemical loading on the epitaxially grown semiconductor structure is avoided to the greatest possible extent, is specified in DE 100 08 583 A1. In the method described therein, firstly a substrate layer is grown on a lattice-matched substrate. The substrate layer is connected to the transparent substrate by means of wafer bonding on the side remote from the lattice-matched substrate. Afterward, the lattice-matched substrate is removed from the connection formed by substrate layer and transparent substrate and the radiation-emitting semiconductor structure is grown epitaxially onto the uncovered side of the substrate layer.

However, the known methods, in which the original provisional substrate is stripped away, require a comparatively high technical outlay. Moreover, transparent substrates are in some instances significantly more expensive than absorbent semiconductor substrates, so that the use of absorbent substrates may often be economically advantageous.

SUMMARY OF THE INVENTION

One object of the present invention is to provide an improved semiconductor substrate, in particular for optoelectronic components, which reflects impinging radiation and thus prevents the absorption of penetrating radiation.

Another object of the present invention is to provide a method for fabricating such a semiconductor substrate, preferably based on a cost-effective absorbent substrate.

This and other objects are attained in accordance with one aspect of the present invention directed to a semiconductor substrate wherein a reflective layer-like zone is formed in the semiconductor substrate. The zone contains impurity material which is introduced into the semiconductor substrate and distributed in layer-like fashion there.

In one aspect, the invention involves a method for fabricating a semiconductor substrate. The method includes implanting impurity material into the semiconductor substrate, and forming a reflective layer-like zone in the semiconductor substrate comprising the impurity material. In order to ensure a high reflectivity, a metal, in particular aluminum or silver, is preferably used as the impurity material. The semiconductor substrate may be any desired substrate which is suitable for the fabrication of semiconductor chips and which may contain, in particular, silicon, silicon carbide or a III-V semiconductor material.

In one embodiment, the semiconductor substrate is subjected to heat treatment to cause at least partial crystallization of the impurity material, or even for formation of a monocrystalline layer of the impurity material, at a temperature $T_2$. In another embodiment, the impurity material includes aluminum and the heat treatment is effected at a temperature $T_2$ of 200° C. to 1000° C. In still another embodiment, the semiconductor substrate includes silicon, and the method further includes implanting carbon into the silicon substrate, heat treating the substrate in order to produce a layer that includes silicon carbide, implanting the impurity material that forms the reflection-increasing layer into a region of the semiconductor substrate which lies below the layer-like zone containing silicon carbide, and heat treating the substrate to cause at least partial crystallization of the impurity material. In yet another embodiment, heat treating the substrate to produce the layer that includes silicon carbide is effected at a temperature $T_1$ of 500° C. to 2000° C. The heat treatment is preferably effected under Si partial pressure.

In one embodiment, the method further includes, after implanting the impurity material, stripping away or removing a silicon layer remaining above the layer that includes silicon carbide. In another embodiment, the stripping away or removing the silicon layer includes bombarding the silicon layer with high-energy ions and subsequently removing the silicon layer by wet-chemical etching. For example, the silicon layer can be bombarded with high-energy ions prior to etching in order to make it amorphous. In still another embodiment, the method further includes forming the layer comprising silicon carbide as an epitaxial surface and subsequently depositing a semiconductor layer sequence onto the epitaxial surface. In yet another embodiment, the semiconductor layer sequence is a radiation-emitting semiconductor layer sequence. In still another embodiment, the semiconductor layer sequence comprises nitride compound semiconductors.

In another embodiment, the method further includes, after implanting the impurity material, stripping away or removing a silicon layer remaining above the layer that includes silicon carbide. In other embodiments, the impurity material includes aluminum and the heat treatment is effected at a temperature $T_2$ of about 350° C., and heat treating the substrate to produce the layer that includes silicon carbide is effected at a temperature $T_1$ of about 1000° C.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is explained in more detail below using two exemplary embodiments in connection with the drawings.

FIGS. 1A to 1C are illustrative diagrams of a fabrication method, according to one embodiment of the invention.

DETAILED DESCRIPTION OF THE PRESENTLY PREFERRED EMBODIMENTS

Figure 2A:
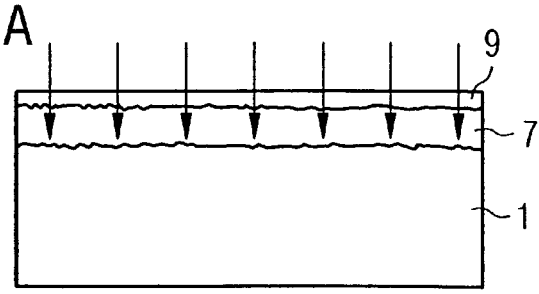
FIGS. 2A to 2E are illustrative diagrams of a fabrication method according to another embodiment of the invention.

FIG. 1A shows a semiconductor substrate 1, which may be, by way of example, silicon (Si), silicon carbide (SiC) or a III-V semiconductor, e.g. GaAs. A layer-like zone 2 containing impurity material is implanted into the semiconductor substrate 1. The impurity material is preferably a metal, particularly preferably aluminum or silver.

The thickness of the layer-like zone 2 is in the range of 10 nm to 100 nm. The implantation depth can be up to a few microns, but should be as small as possible since the aim of the invention is to minimize absorption by the substrate between the surface of the substrate and the layer-like zone 2. The impurity concentration should be as high as possible to achieve a high reflection. However, the invention is not restricted to any impurity concentration nor is it restricted to use of implantation for introducing the impurity material into the substrate, since other methods are known to a person with ordinary skill in the art.

By means of a heat treatment step illustrated diagrammatically in FIG. 1B, the polycrystalline layer-like zone 2 containing impurity material can be converted at least into an at least partly crystalline, or even monocrystalline, layer-like zone 3. A thin layer 4 made of the basic material of the semiconductor substrate 1 remains above the layer 3 containing impurity material.

As is illustrated diagrammatically in FIG. 1C, by way of example, the semiconductor substrate 1 modified in this way has a radiation-emitting layer sequence 5 applied to it, for example by epitaxial growth. By way of example, the radiation-emitting layer sequence 5 may contain nitride compound semiconductors. In this case, a nitride compound semiconductor is understood to be a nitride compound of elements of the third and/or fifth main group, in particular GaN, AlGaN, InGaN, AlInGaN, AlN or InN.

The radiation emitted by the layer sequence 5 in the direction of the semiconductor substrate 1 is reflected at the layer-like zone 3 containing impurity material. The layer 4 which remains above the layer-like zone 3 containing impurity material and is made of the basic material of the semiconductor substrate 1 should therefore be thin enough that the absorption of the radiation emitted by the radiation-emitting layer 5 is negligibly small.

FIG. 2A shows a semiconductor substrate 1 in the form of a silicon substrate. Carbon is implanted into the silicon substrate, for example by means of a thermally decomposable compound such as CO or $CO_2$.

Figure 2B:
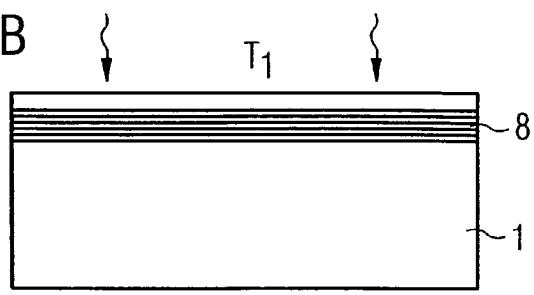

A crystalline SiC layer is produced by means of a heat treatment step illustrated diagrammatically in FIG. 2B. This heat treatment step is carried out a temperature $T_1$ of 500° C. to 2000° C., preferably at about 1000° C.

Figure 2C:
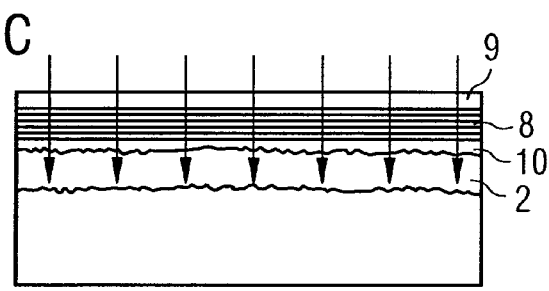

In the subsequent method step illustrated diagrammatically in FIG. 2C, an impurity material, which is preferably a metal, particularly preferably aluminum or silver, is implanted into a region of the semiconductor substrate 1 which lies below the SiC-containing layer-like zone 8. The characteristics of the impurity material in terms of such factors as depth, thickness, concentration and method of introduction can be the same as described above in connection with FIG. 1A.

Figure 2D:
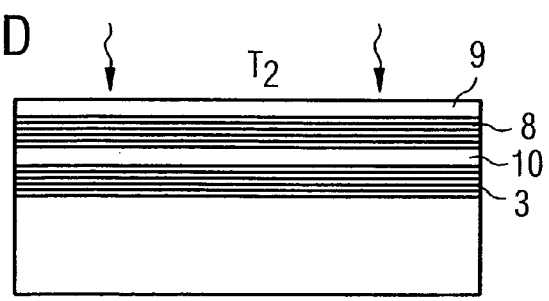

The polycrystalline layer of the impurity material 2 that is produced in this way is converted into an at least partly crystalline, or even monocrystalline, layer-like zone 3 by means of a heat treatment step illustrated diagrammatically in FIG. 2D, at a temperature $T_2$, where $T_2 < T_1$. A thin silicon layer 10 having a thickness of up to about 50 nm, may remain between the layer-like zones 3 and 8 which contain the SiC and the impurity material.

The silicon layer 9 remaining above the layer-like zone 8 containing SiC is preferably removed in a subsequent process step. The silicon layer 9 may be removed for example by wet-chemical etching, the silicon layer 9 preferably being made amorphous beforehand through bombardment with high-energy ions. A so-called "smart-cut" process is likewise suitable, in which microcracks are produced by hydrogen implantation and a subsequent heat treatment and the silicon layer 9 can be stripped away along said microcracks.

The implantation of the SiC layer 8 into the semiconductor substrate 1 made of silicon is done to provide a substrate that can be used for epitaxial growth of materials which can be grown on a SiC surface but not on a silicon surface due to a lattice mismatch, such as III-V-nitride semiconductors. By implantation of C into the silicon substrate, annealing for crystallization, and removal of silicon layer 9 that remains above the SiC layer, a substrate with a SiC surface is made from the silicon substrate. A light emitting layer sequence can be grown on this substrate, as discussed below in connection with FIG. 2E. By this method, an inexpensive silicon substrate is "converted" to a substrate having the surface structure of SiC. This is advantageous because real SiC substrates are expensive and/or only available in small sizes.

Figure 2E:
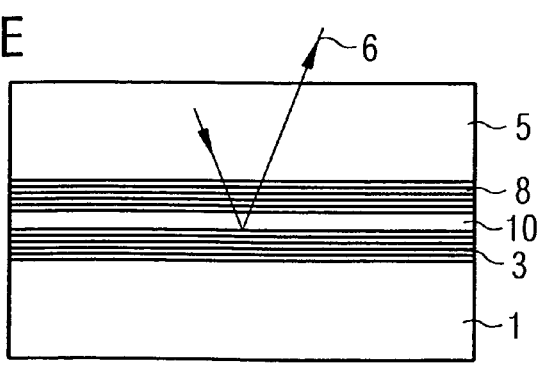

As illustrated by way of example in FIG. 2E, the semiconductor substrate 1 modified in this way may have a radiation-emitting layer sequence 5 applied to it, for example by epitaxial deposition. The radiation 6 emitted by the radiation-emitting layer sequence 5 can penetrate through the partly crystalline layer-like zone 8 containing SiC and a silicon layer 10 situated above the layer-like zone 3 containing the impurity material and is thereupon reflected at the layer-like zone 3 containing the impurity material. The absorption losses of the radiation 6 emitted in the direction of the semiconductor substrate 1 are thereby considerably reduced compared with a conventional absorbent semiconductor substrate.

As an alternative, the semiconductor substrate 1 according to the invention may also serve as a carrier for an LED originally fabricated on another substrate. By way of example, an LED fabricated on a sapphire substrate may be applied to a semiconductor substrate 1 according to the invention by means of a transparent, advantageously conductive, connection. The sapphire substrate is then separated nondestructively, for example by means of a laser stripping process. This is advantageous from an economic standpoint because the expensive sapphire substrate can be reused.

The scope of protection of the invention is not restricted by the description of the invention on the basis of the exemplary embodiments. Rather, the invention encompasses any new feature and also any combination of features, which in particular comprises any combination of features in the patent claims, even if said combination is not specified explicitly in the patent claims.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for fabricating a semiconductor substrate, comprising:
   implanting impurity material into the semiconductor substrate, wherein the semiconductor substrate comprises silicon;
   forming a reflective layer-like zone in the semiconductor substrate comprising said impurity material;
   applying a radiation-emitting semiconductor layer sequence on said semiconductor substrate; and
   implanting carbon into the substrate and heat treating the substrate to produce a layer comprising silicon carbide;
   wherein after implanting the impurity material that forms the reflective layer-like zone the substrate is treated to cause at least partial crystallization of the impurity material.

2. The method as claimed in claim 1, further comprising:
   subjecting the semiconductor substrate to heat treatment to cause at least partial crystallization of the impurity material.

3. The method as claimed in claim 2, wherein the impurity material comprises aluminum and the heat treatment is effected at a temperature of 200° C. to 1000° C.

4. The method as claimed in claim 2, wherein the impurity material comprises aluminum and the heat treatment is effected at a temperature of about 350° C.

5. The method as claimed in claim 1, wherein heat treating the substrate to produce the layer comprising silicon carbide is effected at a temperature of 500° C. to 2000° C.

6. The method as claimed in claim 5, further comprising, after implanting the impurity material, stripping away or removing a silicon layer remaining above the layer comprising silicon carbide.

7. The method as claimed in claim 6, wherein the step of stripping away or removing the silicon layer comprises bombarding the silicon layer with high energy ions and subsequently removing the silicon layer by wet-chemical etching.

8. The method as claimed in claim 6, further comprising:
   forming the layer comprising silicon carbide as an epitaxial surface and subsequently depositing a semiconductor layer sequence onto the epitaxial surface.

9. The method as claimed in claim 8, wherein the semiconductor layer sequence is a radiation emitting semiconductor layer sequence.

10. The method as claimed in claim 9, wherein the semiconductor layer sequence comprises nitride compound semiconductors.

11. The method as claimed in claim 1, further comprising, after implanting the impurity material, stripping away or removing a silicon layer remaining above the layer comprising silicon carbide.

12. The method as claimed in claim 1, wherein heat treating the substrate to produce the layer comprising silicon carbide is effected at a temperature of about 1000° C.

13. A method for fabricating a semiconductor substrate comprising silicon, the method comprising:
   implanting carbon into the semiconductor substrate;
   heat treating the semiconductor substrate to produce a layer comprising silicon carbide;
   implanting impurity material into the semiconductor substrate to form a reflective layer-like zone in the semiconductor substrate comprising said impurity material; and
   heat treating the semiconductor substrate to cause at least partial crystallization of the impurity material.

* * * * *